US012772812B2

(12) United States Patent
Fuchs et al.

(10) Patent No.: US 12,772,812 B2
(45) Date of Patent: Oct. 20, 2026

(54) METHOD OF MANUFACTURING A SEMICONDUCTOR DEVICE HAVING WIDENED OPENINGS IN THE HARD MASK LAYER AND A RECESSED PRE-FILLER SIDE-WALL LAYER

(71) Applicant: Infineon Technologies Dresden GmbH & Co. KG, Dresden (DE)

(72) Inventors: Cornelius Fuchs, Weinböhla (DE); Kimberly Gerber, Dresden (DE); Frank Hoffmann, Freiberg (DE); Matthias Markert, Weinböhla (DE); Rolf Weis, Dresden (DE)

(73) Assignee: Infineon Technologies Dresden GmbH & Co. KG, Dresden (DE)

( * ) Notice: Subject to any disclaimer, the term of this patent is extended or adjusted under 35 U.S.C. 154(b) by 484 days.

(21) Appl. No.: 17/380,250

(22) Filed: Jul. 20, 2021

(65) Prior Publication Data

US 2022/0028727 A1 Jan. 27, 2022

(30) Foreign Application Priority Data

Jul. 27, 2020 (DE) ......................... 102020119738.1

(51) Int. Cl.

| | |
|---|---|
| ***H10W 10/00*** | (2026.01) |
| ***H10D 62/10*** | (2025.01) |
| ***H10W 10/17*** | (2026.01) |
| ***H10W 10/40*** | (2026.01) |

(52) U.S. Cl.

CPC ........ *H10W 10/014* (2026.01); *H10D 62/116* (2025.01); *H10W 10/17* (2026.01)

(58) Field of Classification Search

CPC ........... H01L 21/76224; H01L 21/763; H10W 10/014; H10W 10/17; H10W 10/40

See application file for complete search history.

(56) References Cited

U.S. PATENT DOCUMENTS

| | | | | |
|---|---|---|---|---|
| 5,679,599 | A * | 10/1997 | Mehta | H01L 21/76202 438/447 |
| 6,686,252 | B2 * | 2/2004 | Logan | H01L 27/0921 438/433 |
| 8,338,309 | B2 | 12/2012 | Lee | |
| 9,607,878 | B2 * | 3/2017 | Chen | H01L 21/76224 |
| 10,290,728 | B2 | 5/2019 | Ma et al. | |

(Continued)

FOREIGN PATENT DOCUMENTS

| | | |
|---|---|---|
| CN | 104517955 B | 8/2017 |
| CN | 111244167 A | 6/2020 |

*Primary Examiner* — Anh D Mai
(74) *Attorney, Agent, or Firm* — Murphy, Bilak & Homiller, PLLC

(57) ABSTRACT

A method of manufacturing a semiconductor device is described. The method includes forming a hard mask over a semiconductor substrate. The hard mask is patterned to generate openings in the hard mask. Deep trenches are formed in the semiconductor substrate by etching through the openings in the hard mask. The openings in the hard mask are widened. A pre-filler side wall layer is formed over the widened openings of the hard mask and the side walls of the deep trenches. The pre-filler side wall layer is recessed down to at least a first depth in the semiconductor substrate. The deep trenches are filled with a filler material. A corresponding semiconductor device is also described.

10 Claims, 7 Drawing Sheets

(56) References Cited

U.S. PATENT DOCUMENTS

| | | | | |
|---|---|---|---|---|
| 2002/0135024 | A1 | 9/2002 | Logan et al. | |
| 2004/0180510 | A1 | 9/2004 | Ranade et al. | |
| 2005/0035426 | A1* | 2/2005 | Ko | H01L 21/76232 257/E21.549 |
| 2008/0160697 | A1 | 7/2008 | Kao | |
| 2010/0181640 | A1 | 7/2010 | Shiromoto et al. | |
| 2015/0380538 | A1* | 12/2015 | Ogawa | H01L 29/4916 257/144 |
| 2017/0345892 | A1* | 11/2017 | Lemke | H01L 21/76224 |

* cited by examiner

METHOD OF MANUFACTURING A SEMICONDUCTOR DEVICE HAVING WIDENED OPENINGS IN THE HARD MASK LAYER AND A RECESSED PRE-FILLER SIDE-WALL LAYER

TECHNICAL FIELD

This disclosure relates generally to the field of manufacturing semiconductor devices, and in particular to the field of forming and filling deep trenches in a semiconductor substrate.

BACKGROUND

A variety of semiconductor devices in today's semiconductor industry are based on deep trench fabrication technology. Deep trenches are formed by etching trenches in a semiconductor substrate (e.g. wafer) and by filling the trenches with a filler material.

Due to the high aspect ratio of a deep trench, a deep trench is prone to the formation of a void in the filler material by the filling process. If the void is located near the surface of the semiconductor substrate, subsequent semiconductor processing may open the void. As a result, defect formation as well as a contamination of the semiconductor substrate processing tools and other semiconductor substrates (e.g. wafers) are likely to occur. Hence, a well-controllable process of trench formation and filling is desired. In particular, the process should allow to avoid the generation of voids which are located too close to the surface of the semiconductor substrate.

SUMMARY

According to an aspect of the disclosure, a method of manufacturing a semiconductor device comprising deep trenches filled with a filler material is described. The method comprises forming a hard mask over a semiconductor substrate. The hard mask is patterned to generate openings in the hard mask. Deep trenches are formed in the semiconductor substrate by etching through the openings in the hard mask. The openings in the hard mask are widened. A pre-filler side wall layer is formed over the widened openings of the hard mask and the side walls of the deep trenches. The pre-filler side wall layer is recessed down to at least a first depth in the semiconductor substrate. The deep trenches are filled with a filler material.

According to an aspect of the disclosure, a semiconductor device comprises a semiconductor substrate and deep trenches formed in the semiconductor substrate. A deep trench is filled by a pre-filler side wall layer covering side walls of the deep trench and a filler material filling at least partially a space between opposite sides of the pre-filler side wall layer. The side walls of the deep trench are substantially perpendicular to a surface of the semiconductor substrate at least in an upper region of the deep trench. The pre-filler side wall layer has a recessed opening reaching down to at least a first depth in the semiconductor substrate.

BRIEF DESCRIPTION OF THE DRAWINGS

The elements of the drawings are not necessarily to scale relative to each other, with the exception of the contour-traced scanning electron microscope images which are true to scale. Like reference numerals designate corresponding similar parts. The features of the various illustrated embodiments can be combined unless they exclude each other and/or can be selectively omitted if not described to be necessarily required. Embodiments are depicted in the drawings and are exemplarily detailed in the description which follows.

DETAILED DESCRIPTION

As used in this specification, the terms "deposited", "arranged on", or "applied" or similar terms are not meant to mean that the elements or layers must directly be contacted together; intervening elements or layers may be provided between the "deposited", "arranged on", or "applied" elements, respectively. However, in accordance with the disclosure, the above-mentioned and similar terms may, optionally, also have the specific meaning that the elements or layers are directly contacted together, i.e. that no intervening elements or layers are provided between the "deposited", "arranged on", or "applied" elements, respectively.

Further, the words "over" or "beneath" with regard to a part, element or material layer formed or located "over" or "beneath" a surface may be used herein to mean that the part, element or material layer be located (e.g. placed, formed, arranged, deposited, etc.) "directly on" or "directly under", e.g. in direct contact with, the implied surface. The word "over" or "beneath" used with regard to a part, element or material layer formed or located "over" or "beneath" a surface may, however, either be used herein to mean that the part, element or material layer be located (e.g. placed, formed, arranged, deposited, etc.) “indirectly on” or “indirectly under” the implied surface, with one or more additional parts, elements or layers being arranged between the implied surface and the part, element or material layer.

Figure 1:
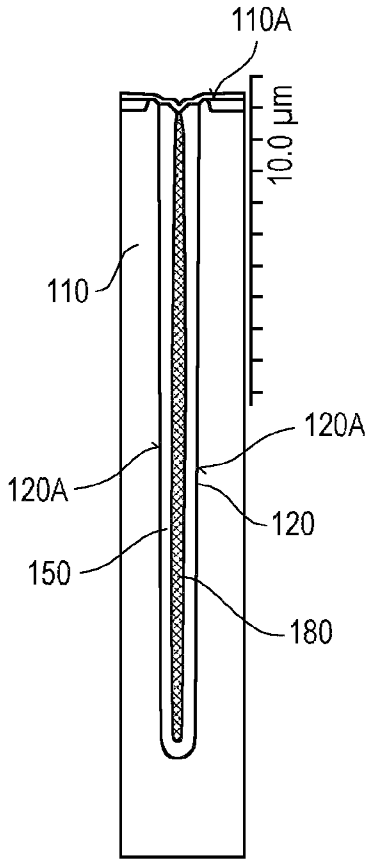
FIG. 1 is a contour-traced scanning electron microscope image illustrating the formation of a void in a deep trench when using conventional processing techniques for deep trench filling.

Referring to FIG. 1, a contour-traced scanning electron microscope (SEM) image of a semiconductor substrate 110 is shown. A deep trench 120 is formed in the semiconductor substrate 110. The side walls of the deep trench 120 are denoted by reference sign 120A. The deep trench 120 is filled with a filler material 150 consisting in this example of poly silicon on a thin oxide.

As apparent from FIG. 1, the fill is incomplete, i.e. a void 180 remains as an unfilled space along the center line of the deep trench 120. The void 180 reaches close to the surface 110A of the semiconductor substrate 110.

Such shallow voids 180 are critical since they may be opened during subsequent semiconductor substrate processes. If the void 180 is opened, defects and/or contamination may occur at the semiconductor substrate (wafer) 110 or in its environment. By way of example, follow-up processes such as shallow trench isolation or etching may penetrate the surface 110A of the semiconductor substrate 110 and thereby open the void 180 in the deep trench 120. In order to avoid trench opening, a controlled closed surface above the void 180 with a sufficient margin for subsequent processes is required.

Figure 2:
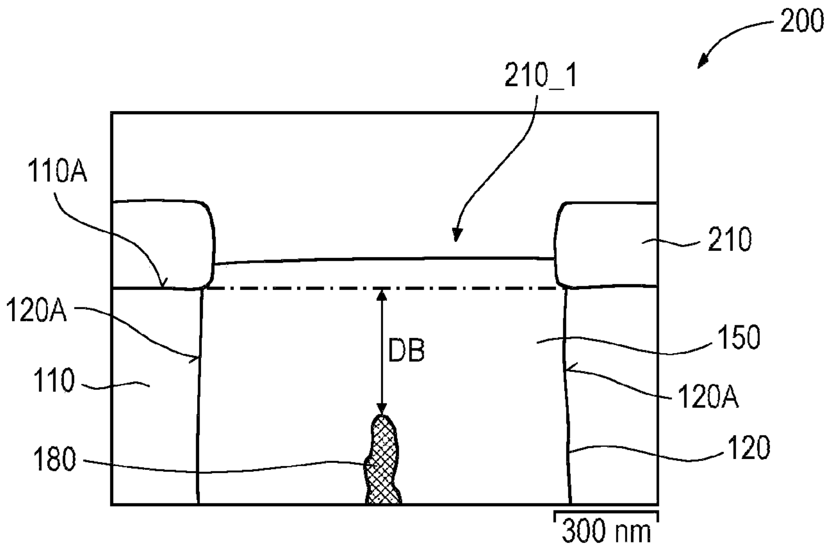
FIG. 2 is a contour-traced scanning electron microscope image illustrating the occurrence of a pinch effect on deep trench filling caused by a hard mask overlaying the semiconductor substrate.

FIG. 2 illustrates a contour-traced SEM image of an upper region 200 of a deep trench 120. A hard mask 210 having an opening 210_1 is disposed over the semiconductor substrate 110. The opening 210_1 of the hard mask 210 had been generated first and then the deep trench 120 had been formed by etching through the opening 210_1 of the hard mask 210. FIG. 2 illustrates that the hard mask 210 may overhang the deep trench 120 by a certain overhang distance. Or, stated differently, the width of the opening 210_1 of the hard mask 210 is somewhat smaller than the width of the deep trench 120.

It has been found that such narrowing of the upper region 200 of the deep trench 120 may cause a pinching effect during the trench fill process. This pinching effect makes it more difficult to avoid the formation of a void 180 during trench filling and, if a void 180 is formed, may lead to a reduction of the burial depth DB of the void 180. The burial depth DB is the distance from the plane of the surface 110A of the semiconductor substrate 110 to the uppermost end of the void 180 or other defects in the filler material 150 which impair or prevent the complete fill of the deep trench 120.

Figure 3:
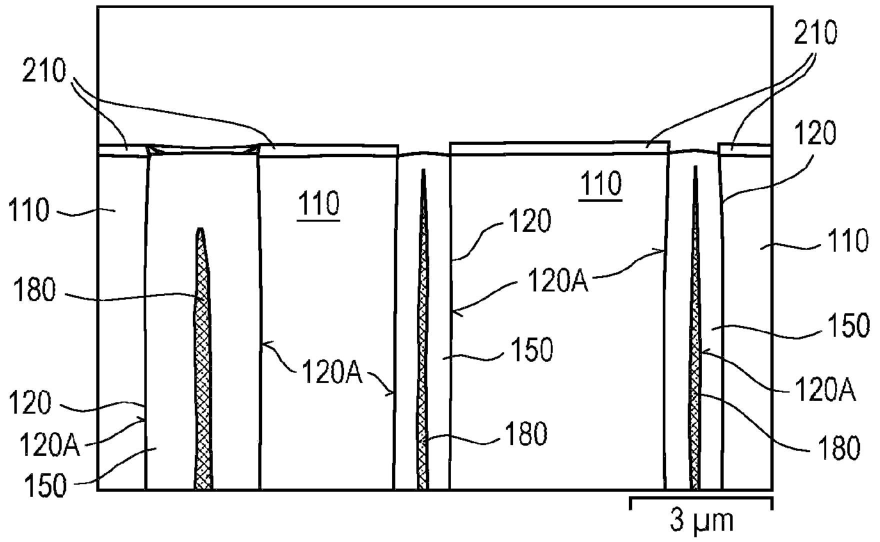
FIG. 3 is a contour-traced scanning electron microscope image illustrating the dependency of the position of voids in deep trenches from the width of the deep trench.

FIG. 3 illustrates deep trenches 120 of different trench widths. As apparent from FIG. 3, the voids 180 of the two deep trenches 120 in the right part of FIG. 3 having a smaller width are shallower than the void 180 of the deep trench 120 in the left part of FIG. 3 having a greater width. In other words, the smaller the width of a deep trench 120, the more difficult it is to guarantee that the burial depth of the void 180 is large enough to guarantee that subsequent processes will not open the void 180 in the deep trench 120.

Figure 4:
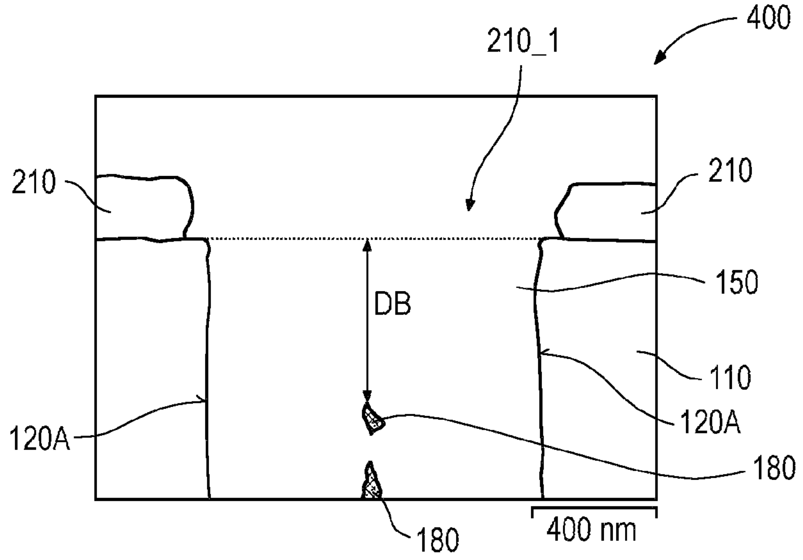
FIG. 4 is a contour-traced scanning electron microscope image illustrating the effect of using a hard mask having a widened opening on deep trench filling.

FIG. 4 illustrates a first measure disclosed herein to cause the burial depth DB of void formation to increase. FIG. 4 illustrates an upper region 400 of a semiconductor substrate 110 which distinguishes from the upper region 200 of FIG. 2 mainly by using a hard mask 210 which has an opening 210_1 which has been widened after deep trench etching and prior to deep trench filling. By widening the opening 210_1 of the hard mask 210, the pinching effect as described in conjunction with FIG. 2 is suppressed. This facilitates the process of deep trench filling and leads to an increase of the burial depth DB of a void 180 (in case a void 180 is formed).

However, as will be described in more detail below, according to the disclosure herein it has been found that this measure alone, though helpful, is not in itself sufficient to guarantee that all of the deep trenches 120 are not opened by subsequent processing. This applies in particular to deep trenches 120 located in the outer region of a wafer where subsequent processes usually penetrate deeper into the surface 110A of the semiconductor substrate 110 and/or if deep trenches 120 having a small width are involved.

Figure 5A:
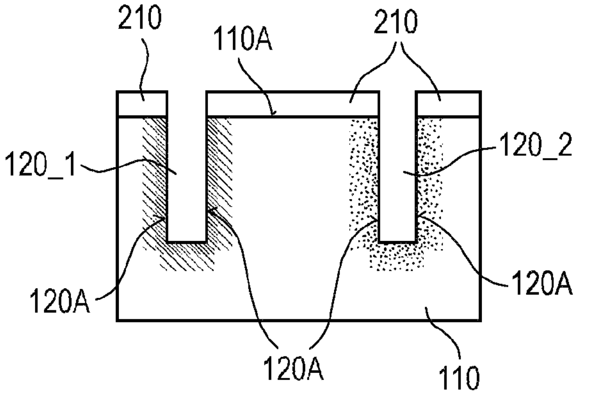
FIGS. 5A-5F are schematic cross-sectional views of an exemplary semiconductor substrate having deep trenches during stages of an exemplary process of filling the deep trenches with a filler material.

Referring to FIGS. 5A-5F a process of filling deep trenches 120 in a semiconductor substrate 110 is illustrated by way of example. FIG. 5A shows a semiconductor substrate 110 in which two deep trenches 120_1, 120_2 are formed. The deep trenches 120_1, 120_2 may be identical in shape and/or type or may be different in shape and/or type. In the example shown in FIG. 5A, the shape of the two trenches 120_1, 120_2 is chosen to be identical (though in general, the deep trenches 120_1 and 120_2 may, e.g., have a different depth and/or may have a different width), but the type of the deep trenches 120_1, 120_2 is, e.g., shown to be different. Moreover, in FIGS. 5A-5F the trench bottoms, and dopant out diffusion around the deep trenches 120_1, 120_2, are depicted with edges, which is only a simplification for illustration, and in reality may resemble shapes shown in FIG. 1.

More specifically, the deep trench 120_1 may have side walls 120A which are doped by an N-type dopant while the deep trench 120_2 may have side walls 120A which are doped by a P-type dopant. The side walls 120A of the deep trenches 120_1, 120_2 may, e.g., be doped with phosphorus, arsenic or antimony (N-type dopants) or with boron (P-type dopant). The dopant density may be high, e.g. $N^+$ or $N^{++}$ and $P^+$ or $P^{++}$ side walls 120A may be used. Hence, the dopant density may exceed $10^{19}$ $cm^{-3}$ (corresponding to $N^{++}/P^{++}$ dopant densities). The deep trenches 120_1, 120_2 may thus form low-ohmic electrical contacts in the semiconductor substrate 110. However, for other purposes it is also possible that dopant densities as small as about $10^{16}$ $cm^{-3}$ are used.

As will be described in more detail further below, such low-ohmic electrical contacts may allow electrically contact from the surface of 110 to buried layers or superjunction (SJ) multi-layers of MOSFET devices, in particular high voltage and/or power MOSFET devices. Further, lateral trench MOSFET and MEMS (micro-electro-mechanical-systems) devices can be equipped with deep trenches 120, 120_1, 120_2 as disclosed herein.

The semiconductor substrate 110 may, e.g., be a semiconductor wafer. The semiconductor substrate 110 may be made of any semiconductor material, e.g. Si, SiC, SiGe, GaAs, GaN, AlGaN, InGaAs, InAlAs, etc. Without loss of generality, the following description exemplarily relates but is not restricted to a semiconductor substrate 110 which is a silicon wafer.

FIG. 5A further illustrates that the hard mask 210 covers the semiconductor surface 110A where no deep trenches 120_1, 120_2 have been formed. In other words, the hard mask 210 may have been used as a mask for deep trench etching. The hard mask 210 may, e.g., comprise or be of silicon nitride.

Figure 5B:
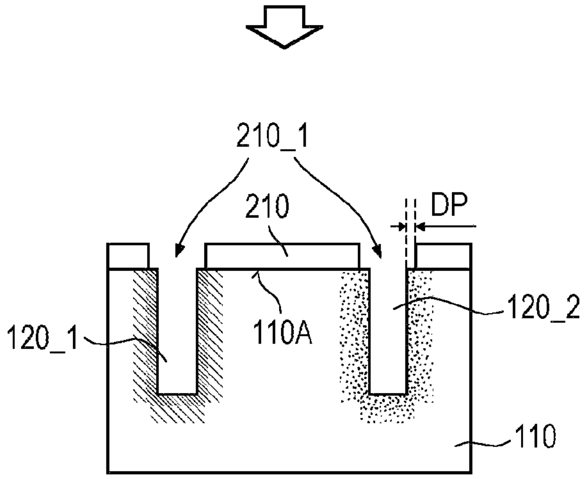

Referring to FIG. 5B, the hard mask openings 210 are widened. Widening of the hard mask openings 210_1 may be carried out by an etch process. This process of widening the hard mask openings 210_1 is also termed hard mask (or nitride) pullback process. The widening (or pullback) distance DP may, e.g., be equal to or greater than 20 nm or 40 nm or 60 nm or 80 nm or 100 nm. DP is the distance measured between the side wall 120A of the deep trench 120 and the widened opening 210_1 of the hard mask 210.

Figure 5C:
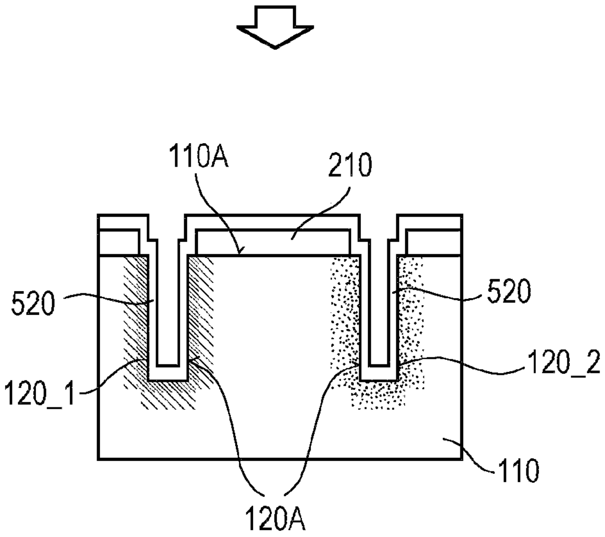

Referring to FIG. 5C a pre-filler side wall layer 520 is formed over the widened openings 210_1 of the hard mask 210 and the side walls 120A of the deep trenches 120_1, 120_2. The material of the pre-filler side wall layer may, e.g., comprise or be of polycrystalline silicon or amorphous silicon. The pre-filler side wall layer 520 has a limited thickness so as to not completely fill the deep trenches 120_1, 120_2. Rather, a central portion of the deep trenches 120_1, 120_2 remains unfilled. Differently put, an empty space remains between opposite sides of the pre-filler side wall layer 520.

As will be described in more detail in conjunction with FIG. 6, an insulating liner layer (not shown) may be generated on the side walls 120A of the deep trenches 120_1, 120_2 prior to the deposition of the pre-filler side wall layer 520. The (optional) insulating liner layer may, e.g., comprise or be of thin silicon oxide or silicon nitride (e.g. less than 1 nm up to 30 nm thickness). The insulating liner layer may help to avoid lattice imperfections at the boundary between the crystalline side walls 120A of the deep trenches 120_1, 120_2 and the material (e.g. polycrystalline silicon or amorphous silicon) of the pre-filler side wall layer 520. Additionally, the insulating liner layer prevents dopant diffusion from the doped trench side walls back into the deep trench 120_1, 120_2 during the following process steps.

Figure 5D:
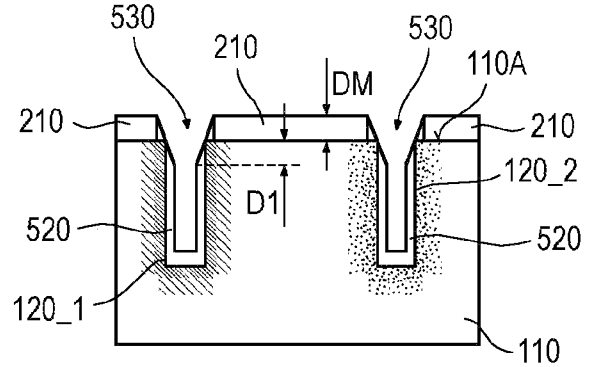

Referring to FIG. 5D, the pre-filler side wall layer 520 is recessed down to at least a first depth D1 in the semiconductor substrate 110 as measured from the surface 110A of the semiconductor substrate 110. Recessing the pre-filler side wall layer 520 creates an opening area 530 of the deep trench 120_1, 120_2. Recessing the pre-filler side wall layer 520 may be carried out by a non-isotropic recess etch.

The opening area 530 may have a tapered shape. The tapered shape of the opening area 350 may extend from a certain distance above the surface 110A of the semiconductor substrate 110 through the plane of the surface 110A down to at least a first distance D1 beneath the surface 110A of the semiconductor substrate 110. For instance, the tapered shape of the opening area 350 may extend from the upper surface of the hard mask 210 down to a distance D1 beneath the surface 110A.

For example, the thickness DM of the hard mask 210 may, e.g., be in a range between 50 nm and 350 nm. For instance, the thickness DM of the hard mask 210 may be 250 nm. It is to be noted that by recessing the pre-filler side wall layer 210 the initial thickness of the hard mask 210 may have been reduced by a certain distance, e.g., about 10 to 100 nm (not shown). That is, for instance, the thickness DM of the hard mask 210 in FIG. 5D may be 150 nm if, e.g., a hard mask 210 of an initial thickness of 250 nm had been applied, or the thickness DM of the hard mask 210 in FIG. 5D may be 250 nm if, e.g., a hard mask 210 of an initial thickness of 350 nm had been applied.

Hence, the tapered shape of the opening area 530 may extend upwards and downwards and through the plane of the surface 110A of the semiconductor substrate 110. More specifically, the tapered-shaped opening area 530 may have a length composed of a portion defined by the (residual) thickness DM of the hard mask 210 above the surface 110A of the semiconductor substrate 110 (or a part of this length) and a portion defined by the thickness of the pre-filler side wall layer 520 and the slope of the tapered opening area 530 beneath the surface 110A of the semiconductor substrate 110.

Figure 5E:
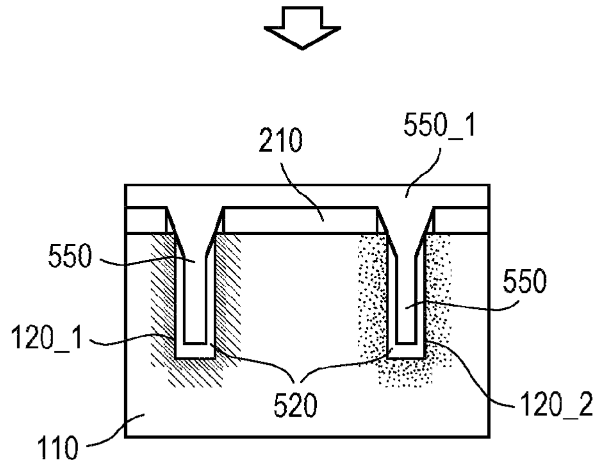

Referring to FIG. 5E, the pre-filled deep trenches 120_1, 120_2 may then be filled with a filler material 550. By this process a layer 550_1 of filler material 550 covering the semiconductor substrate 110 and the hard mask 210 may be formed. The filler material 550 may be the same material as the material of the pre-filler side wall layer 520 or may be of a different material. For instance, the filler material 550 may comprise or be polycrystalline silicon or amorphous silicon or silicon nitride or glass.

In one example the material of the pre-filler side wall layer 520 is polycrystalline silicon and the filler material 550 is also polycrystalline silicon. Using the same material may be beneficial for mitigating or avoiding the formation boundary defects between the material of the pre-filler side wall layer 520 and the filler material 550.

The material of the pre-filler side wall layer 520, the filler material 550 and the material of the (optional) insulating liner layer (not shown) may be non-conductive or intrinsic (i.e. undoped) materials.

The filler material 550 may fill the deep trenches 120_1, 120_2 (or, more precisely, the empty space between opposite sides of the pre-filler side wall layer 520) completely or at least in a way that buried voids (not shown) in the filler material 550 are located sufficiently far away from the plane of the surface 110A of the semiconductor substrate 110 so that they are not opened by subsequent semiconductor manufacturing processes.

Figure 5F:
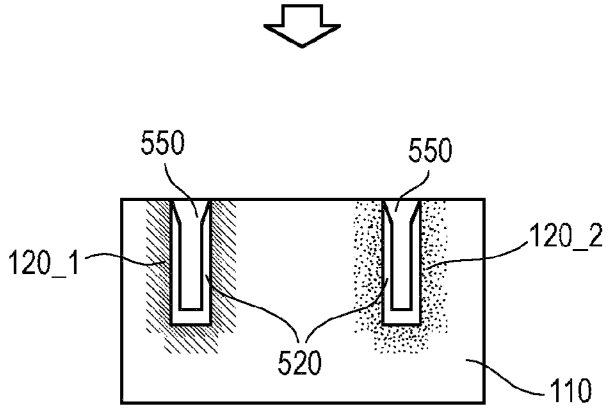

Referring to FIG. 5F, the layer 550_1 of filler material 550 covering the semiconductor substrate 110 and the hard mask 210 may then be removed. Removal may, e.g., be carried out by planarization processes such as, e.g., planarizing dry etch processes and/or CMP processes down to the hard mask 210 followed by an isotropic recess etch for height leveling and final hard mask strip.

Figure 6:
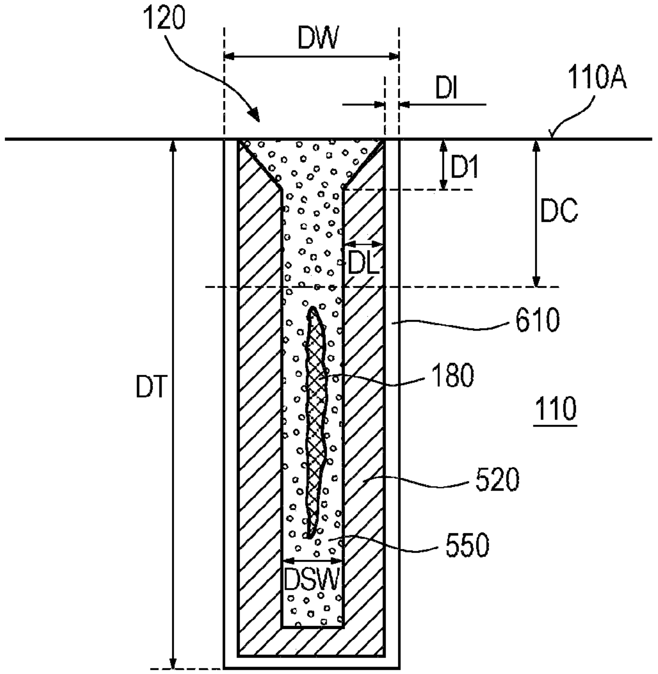
FIG. 6 is a schematic cross-sectional view of a semiconductor substrate having a deep trench filled with a pre-filler side wall layer and a filler material.

FIG. 6 illustrates a deep trench 120 filled by a material stack comprising of an (optional) insulating liner layer 610, the pre-filler side wall layer 520 and the filler material 550. Further, a void 180 generated in the filler material 550 during the filling process is depicted.

A trench width DW may, e.g., be in a range from 0.4 μm to 5 μm, or 1.0 μm to 2 μm, or 0.8 μm to 1.5 μm. For instance, DW=1.2 μm.

A depth DT of the deep trench 120 may, e.g., be in a range from 5 μm to 100 μm, or 10 μm to 25 μm. For instance, DT=15 μm.

The layer thickness DL of the pre-filler side wall layer 520 may, e.g., be in a range from 100 nm to 500 nm, or 250 nm to 400 nm. For instance, DL=250 nm, depending on the trench opening width DW.

The recess depth D1 may, e.g., be in a range from 200 nm to 5000 nm, or 300 nm to 800 nm. For instance, D1=350 nm.

The thickness DI of the (optional) insulating liner layer 610 may, e.g., be equal to or less than 30 nm, 10 nm, or 5 nm, and may even be less than 1 nm.

DSW denotes the width of the space between opposite side walls of the pre-filler side wall layer 520. DSW may, e.g., be in a range from 50 to 3000 nm, or 300 to 500 nm. For instance, DSW=400 nm.

The burial depth of the void 180 should be equal to or greater than a critical depth DC as measured from the plane of the surface 110A of the semiconductor substrate 110. DC may, e.g., be equal to or greater than 500 nm, 600 nm, 700 nm, 800 nm, or 1000 nm.

From the foregoing it can be appreciated that only the combination of widening the openings 210_1 in the hard mask 210 and recessing the pre-filler side wall layer 520 in the opening area 530 (see FIG. 5D) has the ability to create a recessed (e.g. tapered) opening area 530 effective to prevent the occurrence of shallow voids 180 as explained in conjunction with FIG. 6.

Figures 7A, 7B, 8:
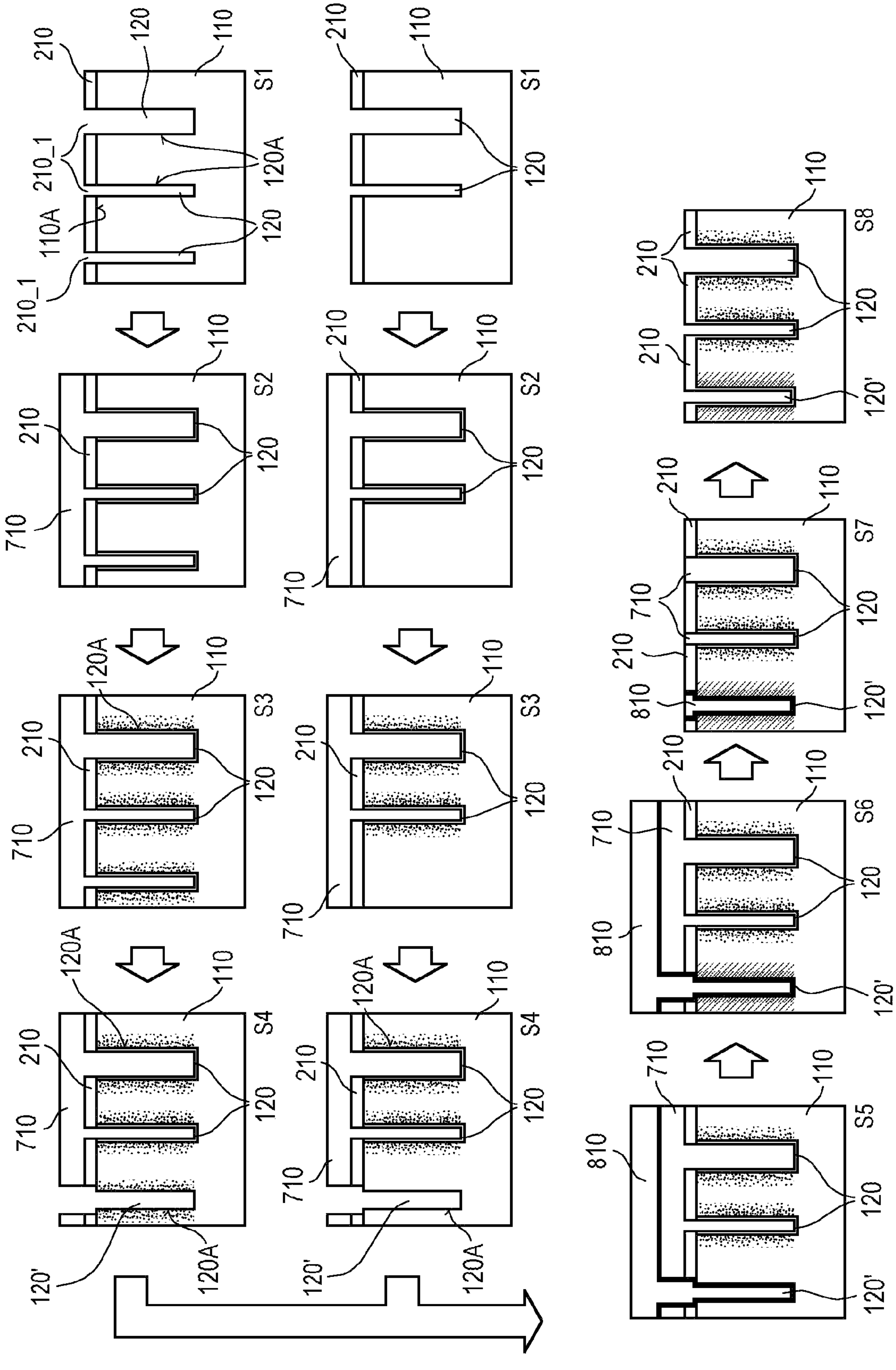
FIG. 7A illustrate exemplary stages of a first example of a process of forming deep trenches having side walls doped with a first dopant.
FIG. 7B illustrate exemplary stages of a second example of a process of forming deep trenches having side walls wherein some of the side walls are doped with a first dopant.
FIG. 8 illustrate exemplary stages of an example of a process of doping some of the deep trenches as produced by, e.g., the exemplary processes of FIG. 7A or 7B with a second dopant.

FIG. 7A or 7B in combination with FIG. 8 illustrate two exemplary processes of forming deep trenches having side walls doped by a first dopant and a second dopant. These examples are suitable to produce a structure as shown, e.g., in FIG. 5A.

At S1 in FIG. 7A a hard mask 210 is deposited over a semiconductor substrate 110. The hard mask 210 is patterned to generate openings 210_1 in the hard mask 210. Deep trenches 120, having a high aspect ratio and a narrow trench opening with side walls 120A close to 90° relative to the surface 110A of the semiconductor substrate 110, are formed. Patterning and trench formation is carried out by lithography and semiconductor substrate etching.

At S2 glass 710 doped with a first-type dopant may be deposited over the semiconductor substrate 110 and into the deep trenches 120. The first dopant may, e.g., be a P-type dopant.

At S3 a reflow anneal at temperatures equal to or less than 950° C. is used to form a closed glass surface over the trenches for further structuring processes while the first dopant starts to diffuse out of the glass into the semiconductor substrate 110.

At S4 a deep trench 120' which is configured to be doped by a second-type dopant is opened up (i.e. the doped glass 710 is removed from this trench 120') by a structuring process.

Exemplary stages S1 to S4 of a second example of a process of forming deep trenches 120 having side walls 120A doped by a first-type dopant are illustrated in FIG. 7B. In this example, stages S1 to S4 are identical to the stages S1 to S4 of FIG. 7A, respectively, except that the deep trench 120' configured to be doped by a second-type dopant is only formed at stage S4. While this allows the formation of a second-type deep trench 120' without having first-type doped side walls 120A (i.e. with undoped side walls 120A), two deep trench formation processes (at S1 and S4) are required.

At S5 of FIG. 8, a second-type doped glass 810 is deposited over the semiconductor substrate 110 as shown at S4 in FIG. 7A or at S4 in FIG. 7B.

At S6 another anneal process is carried out to diffuse the first and second-type dopants out of the respective glass depositions into the side walls 120A of the first and second-type deep trench 120 and 120'. This process is also referred to as a drive-in anneal. A relatively high thermal budget is required for this process and it is therefore usually carried out prior to further front-end-of line (FEOL) semiconductor processing. In order to limit the impact of this thermal budget to the CMOS (complementary metal-oxide-semiconductor) logic or other integrated devices and to minimize requalification efforts, the reflow anneal is carried out prior to the processing (e.g. CMOS processing) of the semiconductor substrate 110. This, on the other hand, implies that some semiconductor processes such as, e.g., CMOS shallow trench isolation processes are required to be carried out at a later stage of semiconductor processing. In other words, in many cases the reflow anneal of S3 has to be carried out at an early stage of front-end-of-line (FEOL) processing, e.g. before the fabrication of the integrated electronic devices (e.g. transistors, capacitors, resistors) in the semiconductor substrate 110.

During this drive-in anneal process, the side walls 120A of the first-type doped deep trenches 120 are doped to obtain a higher first-type dopant concentration while the side walls 120A of the second-type doped deep trench 120' are counter-doped by the second-type dopant (if the process of FIG. 7A had been carried out) or doped by the second-type dopant (if the process of FIG. 7B had been carried out).

At S7 the highly-doped glass layers 710, 810 may be removed by planarization down to the hard mask 210.

At S8 the second-type doped glass in the deep trench 120' and the first-type doped glass in the trenches 120 are both completely removed. As a result, a structure similar to the structure shown in FIG. 5A having deep trenches 120_1 (corresponding, e.g., to deep trenches 120') with second-type doped sidewalls 120A and deep trenches 120_2 (corresponding, e.g., to deep trenches 120) with first-type doped sidewalls 120A may be obtained.

It is to be noted that other processes are feasible to generate a structure as shown in FIG. 8 at S8. Further, as mentioned before, the disclosure herein also covers the generation of deep trenches 120 with single-type doped side walls 120A or with undoped side walls 120A.

Figure 9:
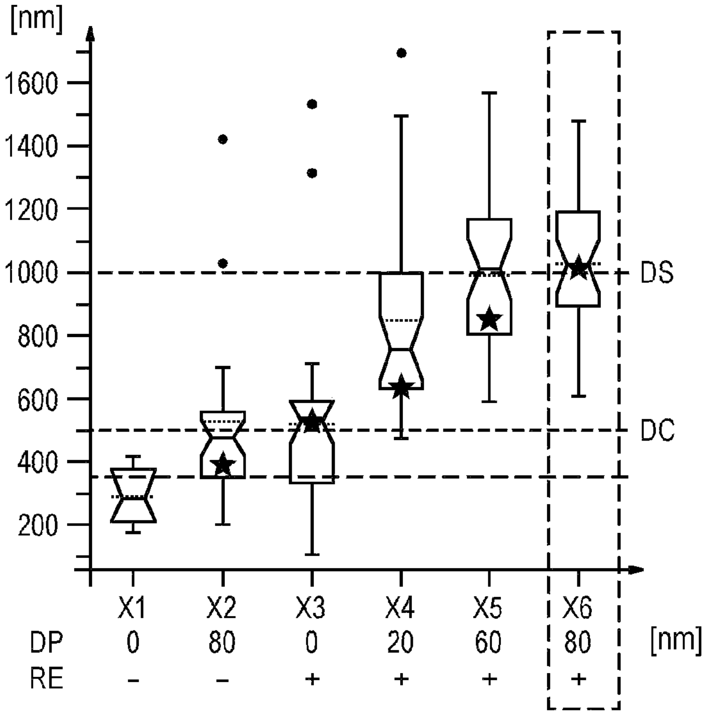
FIG. 9 is a diagram illustrating the effects of widening the hard mask opening and recessing the pre-filler side wall layer on the burial depth of a void formed in the filler material.

FIG. 9 is a diagram illustrating measurement results of the burial depth of voids in deep trenches, wherein different widening (or nitride pullback) distances DP (see FIG. 5B) of the hard mask 210 and either recessing (RE: +) or no recessing (RE: −) of the pre-filler side wall layer 520 (see FIG. 5D) were used. More specifically, at X1, DP=0 nm and no recess etch (RE: −) was applied,
at X2, DP=80 nm and no recess etch (RE: −) was applied,
at X3, DP=0 nm and a recess etch (RE: +) was applied,
at X4, DP=20 nm and a recess etch (RE: +) was applied,
at X5, DP=60 nm and a recess etch (RE: +) was applied, and
at X6, DP=80 nm and a recess etch (RE: +) was applied.

In FIG. 9 the stars indicate the medians of measured burial depths of voids and the error bars indicate the range of fluctuations from which the standard deviations (expanded central region of the error bars) were calculated.

Assuming a critical burial depth of voids of DC=500 nm, only the combination of hard mask pullback (DP=20 nm and more) and recess etch (RE: +) satisfies this requirement. The best results (X6) are obtained with recess etch (RE: +) and maximum hard mask pullback (DP=80 nm). The measurement results displayed in the diagram of FIG. 9 provide strong evidence for the existence of a combined effect of hard mask widening ("hard mask pullback") and pre-filler side wall layer recess etch.

Figure 10:
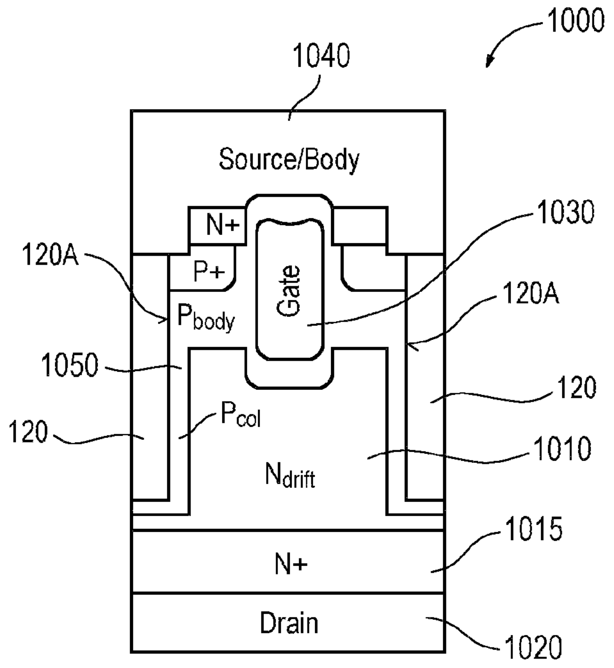
FIG. 10 is a schematic cross-sectional view of an exemplary semiconductor device comprising a semiconductor substrate having deep trenches with side walls doped with a dopant.

FIG. 10 illustrates an example of a semiconductor device 1000 having deep trenches 120 with side wall layers doped with a dopant. The exemplary semiconductor device 1000 is a SJ MOSFET device. The semiconductor device 1000 may be a high-voltage device. Side walls 120A of the deep trenches 120 and a body region 1050 are P-type doped ($P_{col}$, $P_{body}$). Between the two trenches 120, the substrate 1010 is configured as a N-type mesa region ($N_{drift}$). The bottom region 1015 of the substrate 1010 is $N^+$-doped and covered by a drain metal 1020. The gate 1030 is located between the two low-ohmic deep trenches 120 and beneath the source/body metal 1040 in a P-doped body region ($P_{body}$).

Generally, deep trenches (DT) as described herein may be used as trench gates and/or trench contacts in power and/or high-voltage integrated circuits and wide-bandgap power semiconductor devices. For instance, DT-SJ MOSFET devices, e.g. SJ SiC VDMOS (vertically diffused MOS) devices with deep trenches as well as MEMS devices are possible semiconductor devices using the deep trench filling technique as described herein. All these and other semiconductor devices may include deep trenches with uncritical void burial depths as specified above.

The following examples pertain to further aspects of the disclosure:

Example 1 is a method of manufacturing a semiconductor device, the method comprising forming a hard mask over a semiconductor substrate; patterning the hard mask to generate openings in the hard mask; forming deep trenches in the semiconductor substrate by etching through the openings in the hard mask; widening the openings in the hard mask; forming a pre-filler side wall layer over the widened openings of the hard mask and the side walls of the deep trenches; recessing the pre-filler side wall layer down to at least a first depth in the semiconductor substrate; and filling the deep trenches with a filler material.

In Example 2, the subject matter of Example 1 can optionally include wherein the first depth is 200 nm or 250 nm or 300 nm or 500 nm or 1000 nm or 2000 nm.

In Example 3, the subject matter of Example 1 or 2 can optionally include wherein recessing the pre-filler side wall layer is carried out by non-isotropic etching.

In Example 4, the subject matter of any preceding Example can optionally include wherein a layer thickness of the pre-filler side wall layer is equal to or greater than 100 nm or 200 nm or 250 nm or 300 nm or 500 nm.

In Example 5, the subject matter of any preceding Example can optionally include wherein the openings in the hard mask are widened by a widening distance of equal to or greater than 20 nm or 40 nm or 60 nm or 80 nm or 100 nm.

In Example 6, the subject matter of any preceding Example can optionally include wherein the side walls of the deep trenches remain unchanged in width at least in upper regions of the deep trenches.

In Example 7, the subject matter of any preceding Example can optionally further include forming an insulating liner layer over the widened openings in the hard mask and the side walls of the deep trenches before forming the pre-filler side wall layer.

In Example 8, the subject matter of any preceding Example can optionally include wherein doping the side walls of the deep trenches by depositing a dopant into the side walls by dopant diffusion.

In Example 9, the subject matter of any preceding Example can optionally include wherein doping the side walls of the deep trenches comprises depositing a dopant donator in the deep trenches before forming the pre-filler side wall layer; allowing the dopant in the dopant donator to diffuse out into the side walls of the deep trenches; and removing the dopant donator.

In Example 10, the subject matter of any preceding Example can optionally include wherein the pre-filler side wall layer comprises polycrystalline silicon or amorphous silicon.

In Example 11, the subject matter of any preceding Example can optionally include wherein the filler material comprises polycrystalline silicon or amorphous silicon or silicon nitride or glass.

In Example 12, the subject matter of any preceding Example can optionally include wherein the hard mask comprises silicon nitride.

Example 13 is a semiconductor device including a semiconductor substrate; and deep trenches formed in the semiconductor substrate, wherein a deep trench is filled by a pre-filler side wall layer covering side walls of the deep trench, and a filler material filling at least partially a space between opposite sides of the pre-filler side wall layer, wherein the side walls of the deep trench are substantially perpendicular to a surface of the semiconductor substrate at least in an upper region of the deep trench, and the pre-filler side wall layer has a recessed opening reaching down to at least a first depth in the semiconductor substrate.

In Example 14, the subject matter of Example 13 can optionally include wherein the first depth is 200 nm or 250 nm or 300 nm or 500 nm or 1000 nm or 2000 nm.

In Example 15, the subject matter of Example 13 or 14 can optionally include wherein a layer thickness of the pre-filler side wall layer is equal to or greater than 100 nm or 200 nm or 250 nm or 300 nm or 500 nm.

In Example 16, the subject matter of any of Examples 13 to 15 can optionally further include an insulating liner layer arranged between the side wall of the deep trench and the pre-filler side wall layer.

In Example 17, the subject matter of any of Examples 13 to 16 can optionally include wherein the side wall of the deep trench is doped with a dopant.

In Example 18, the subject matter of any of Examples 13 to 17 can optionally include wherein the filler material completely fills the space between the opposite sides of the pre-filler side wall layer.

In Example 19, the subject matter of any of Examples 13 to 18 can optionally include a buried void in the filler material, wherein the burial depth of the buried void below the surface of the semiconductor substrate is equal to or greater than 500 nm or 750 nm or 1000 nm.

In Example 20, the subject matter of any of Examples 13 to 19 can optionally include wherein the deep trench has a depth equal to or greater than a second depth in the semiconductor substrate, wherein the second depth is 5 μm or 10 μm or 15 μm or 20 μm or 50 μm or 100 μm.

In Example 21, the subject matter of Examples 13 to 20 can optionally include wherein the semiconductor device is a high-voltage MOSFET device and the deep trenches form electrical contacts connecting buried layers or superjunction multi-layers of the MOSFET high-voltage device.

Although specific embodiments have been illustrated and described herein, it will be appreciated by those of ordinary skill in the art that a variety of alternate and/or equivalent implementations may be substituted for the specific embodiments shown and described without departing from the scope of the present invention. This application is intended to cover any adaptations or variations of the specific embodiments discussed herein. Therefore, it is intended that this invention be limited only by the claims and the equivalents thereof.

What is claimed is:

1. A method of manufacturing a semiconductor device comprising deep trenches filled with a filler material, the method comprising:

forming a hard mask over a semiconductor substrate;

patterning the hard mask to generate openings in the hard mask;

forming deep trenches in the semiconductor substrate by etching through the openings in the hard mask;

doping side walls of the deep trenches by dopant diffusion;

after forming the deep trenches in the semiconductor substrate and doping the side walls of the deep trenches, widening the openings in the hard mask;

forming a pre-filler side wall layer over the widened openings of the hard mask and an entire bottom and the side walls of the deep trenches;

recessing the pre-filler side wall layer down to at least a first depth in the semiconductor substrate; and filling the deep trenches with a filler material, wherein the filler material covers the pre-filler side wall layer formed over the entire bottom and the side walls of the deep trenches.

2. The method of claim 1, wherein the first depth is 200 nm or 250 nm or 300 nm or 500 nm or 1000 nm or 2000 nm.

3. The method of claim 1, wherein recessing the pre-filler side wall layer is carried out by non-isotropic etching.

4. The method of claim 1, wherein a layer thickness of the pre-filler side wall layer is equal to or greater than 100 nm or 200 nm or 250 nm or 300 nm or 500 nm.

5. The method of claim 1, wherein the openings in the hard mask are widened by a widening distance of equal to or greater than 20 nm or 40 nm or 60 nm or 80 nm or 100 nm.

6. The method of claim 1, wherein the side walls of the deep trenches remain unchanged in width at least in upper regions of the deep trenches.

7. The method of claim 1, further comprising:

forming an insulating liner layer over the side walls of the deep trenches before forming the pre-filler side wall layer.

8. The method of claim 1, wherein the pre-filler side wall layer comprises polycrystalline silicon or amorphous silicon.

9. The method of claim 1, wherein the filler material comprises polycrystalline silicon or amorphous silicon or silicon nitride or glass.

10. The method of claim 1, wherein the hard mask comprises silicon nitride.

* * * * *